(12) United States Patent
Van Der Sijde et al.

(10) Patent No.: US 10,222,681 B2
(45) Date of Patent: Mar. 5, 2019

(54) SEGMENTED LIGHT OR OPTICAL POWER EMITTING DEVICE WITH FULLY CONVERTING WAVELENGTH CONVERTING MATERIAL AND METHODS OF OPERATION

(71) Applicant: Lumileds LLC, San Jose, CA (US)

(72) Inventors: Arjen Gerben Van Der Sijde, Eindhoven (NL); Quint Van Voorst Vader, Eindhoven (NL); Nicola Pfeffer, Eindhoven (NL)

(73) Assignee: Limileds LLC, San Jose, CA (US)

( * ) Notice: Subject to any disclaimer, the term of this patent is extended or adjusted under 35 U.S.C. 154(b) by 0 days.

(21) Appl. No.: 15/803,803

(22) Filed: Nov. 5, 2017

(65) Prior Publication Data

US 2018/0129121 A1    May 10, 2018

Related U.S. Application Data

(60) Provisional application No. 62/418,447, filed on Nov. 7, 2016.

(51) Int. Cl.
*H01L 33/00* (2010.01)
*H05B 41/36* (2006.01)
(Continued)

(52) U.S. Cl.
CPC ............ *G03B 15/02* (2013.01); *F21K 9/64* (2016.08); *F21V 5/045* (2013.01); *H01L 27/153* (2013.01); *H01L 27/156* (2013.01); *H01L 33/502* (2013.01); *H01L 33/505* (2013.01); *H05B 33/0842* (2013.01); *H05B 33/0845* (2013.01); *H05B 33/0872* (2013.01); *H05B 37/0218* (2013.01); *F21Y 2115/10* (2016.08); *G03B 15/03* (2013.01); *H01L 33/0079* (2013.01);
(Continued)

(58) Field of Classification Search
None
See application file for complete search history.

(56) References Cited

U.S. PATENT DOCUMENTS 5,898,185 A    4/1999  Bojarczuk, Jr. et al.
6,734,465 B1   5/2004  Taskar et al.
(Continued)

FOREIGN PATENT DOCUMENTS

WO    2017/080875    5/2017

*Primary Examiner* — Dedei K Hammond
(74) *Attorney, Agent, or Firm* — Volpe and Koenig, P.C.

(57) ABSTRACT

A segmented light or optical power emitting device and an illumination device are described. The segmented device includes a die having a light or optical power emitting semiconductor structure that includes an active layer disposed between an n-layer and a p-layer. Trenches are formed in at least the semiconductor structure and separate the die into individually addressable segments. The active layer emits light or optical power having a first color point or spectrum. At least one wavelength converting layer is adjacent the die and converts the light or optical power to light or optical power having at least one second color point or spectrum and limits an energy ratio of the pump light or optical power that passes through the at least one wavelength converting layer unconverted to total light or optical power emitted by the light or optical power emitting device to less than 10%.

23 Claims, 13 Drawing Sheets

(51) Int. Cl.
| | |
|---|---|
| *G03B 15/02* | (2006.01) |
| *H05B 33/08* | (2006.01) |
| *F21V 5/04* | (2006.01) |
| *F21K 9/64* | (2016.01) |
| *H01L 33/50* | (2010.01) |
| *H01L 27/15* | (2006.01) |
| *H05B 37/02* | (2006.01) |
| *F21Y 115/10* | (2016.01) |
| *G03B 15/03* | (2006.01) |

(52) U.S. Cl.
CPC .... *H01L 33/507* (2013.01); *H01L 2933/0091* (2013.01)

(56) References Cited

U.S. PATENT DOCUMENTS

| | | |
|---|---|---|
| 8,759,125 B2 | 6/2014 | Tischler |
| 9,257,617 B2 | 2/2016 | Bierhuizen |
| 2006/0126326 A1 | 6/2006 | Ng et al. |
| 2008/0272712 A1* | 11/2008 | Jalink ............... H01L 27/153 315/291 |
| 2009/0108269 A1 | 4/2009 | Negley et al. |
| 2016/0163931 A1 | 6/2016 | Schricker et al. |
| 2016/0247855 A1 | 8/2016 | von Malm |

\* cited by examiner

US 10,222,681 B2

SEGMENTED LIGHT OR OPTICAL POWER EMITTING DEVICE WITH FULLY CONVERTING WAVELENGTH CONVERTING MATERIAL AND METHODS OF OPERATION

CROSS REFERENCE TO RELATED APPLICATION

This application claims the benefit of U.S. Provisional Patent Application No. 62/418,447, filed Nov. 7, 2016, which is incorporated by reference as if fully set forth.

BACKGROUND

Semiconductor light-emitting devices or optical power emitting devices (such as devices that emit ultraviolet (UV) or infrared (IR) optical power), including light emitting diodes, resonant cavity light emitting diodes, vertical cavity laser diodes, and edge emitting lasers are among the most efficient light sources currently available. Due to their compact size and lower power requirements, for example, semiconductor light or optical power emitting devices (referred to herein as LEDs for simplicity) are attractive candidates for light sources, such as camera flashes, for hand-held battery-powered devices, such as cameras and cell phones. They may also be used for torch for video, and for general illumination, such as home, shop, office and studio lighting, theater/stage lighting and architectural lighting. A single LED often provides light that is less bright than a typical light source, and, therefore, arrays of LEDs are often used for such applications.

SUMMARY

A segmented light or optical power emitting device and an illumination device are described. The segmented device includes a die having a light or optical power emitting semiconductor structure that includes an active layer disposed between an n-layer and a p-layer. Trenches are formed in at least the semiconductor structure and separate the die into individually addressable segments. The active layer emits light or optical power having a first color point or spectrum. At least one wavelength converting layer is adjacent the die and converts the light or optical power to light or optical power having at least one second color point or spectrum and limits an energy ratio of the pump light or optical power that passes through the at least one wavelength converting layer unconverted to total light or optical power emitted by the light or optical power emitting device to less than 10%.

DETAILED DESCRIPTION OF THE PREFERRED EMBODIMENTS

Figure 1A:
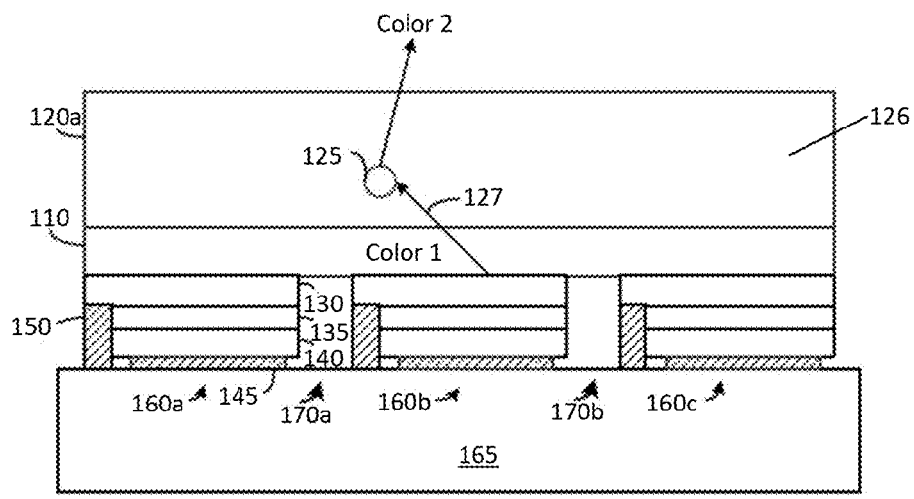
FIG. 1A is a diagram providing a view of a cross section of an example segmented LED taken across three addressable segments with a single fully converting wavelength converting layer over all segments.

A segmented semiconductor light or optical power emitting device (referred to herein as LEDs for simplicity) is described herein that includes a single semiconductor die with trenches formed therein that electrically insulate individual segments of the die from one another. Each segment may be individually contacted and coupled to metal traces on a circuit board such that the segments may be individually addressed. As compared to an array of individual LEDs, a segmented LED as described herein may be produced via easier manufacturing in the assembly (e.g., less pick and place steps with precise positioning may be required) and with greatly reduced cost. Further, a segmented LED may have a reduced volume (size) than an array of individual LEDs.

In embodiments described herein, a device may incorporate more than one segmented LED (e.g., a dual LED flash module) where each segmented LED provides light of a particular color point or spectrum. Individual segments of the segmented LEDs may be addressed, while other segments remain off, to provide a precise color point or target spectrum controlled flash or other output light (such as for torch for video, studio lighting, theater/stage lighting or architectural lighting). For example, for a dual LED flash module, segments in a cool white segmented LED and segments in a warm white segmented LED may be selectively addressed to provide a combined output light that is warmer or cooler depending on the ambient light. Other colors or spectra of LEDs and/or segments may also be used to produce a finely tuned color point or target spectrum.

The overall brightness level of the flash module or other lighting module may be increased or decreased, even with the same drive current, by addressing more or fewer segments in the segmented LEDs. The brightness may also be varied by varying the drive current. Further, various lighting effects may be achieved by projecting an image of the segmented LEDs onto a scene to be photographed and varying the brightness and/or color point or target spectrum of the flash projected onto different regions of the scene.

For a segmented LED, or any device that includes multiple LEDs or segments that are closely spaced, it is likely that at least some of the pump light or optical power (i.e., unconverted light or optical power emitted by the active layer of an LED) emitted by one LED or segment will cross into neighboring LEDs or segments. When this happens, depending on the makeup of the phosphors in the neighboring LED or segment and the color point or spectrum of the pump light, the light that crosses into the neighboring LED or segment may activate its phosphors. Thus, a neighboring LED or segment that is not being energized may emit a pure phosphor color or spectrum. For example, for an array of LEDs or segments emitting blue pump light that are covered by a Yttrium aluminum garnet (YAG) phosphor layer, a neighboring LED or segment that is not being energized may light up yellow when blue pump light from a neighboring LED crosses into it. This phenomenon may be undesirable for a number of reasons, including, for example, that it may alter the color point or spectrum of the composite light or optical power output by the LED or array in applications where the light or optical power output is blended or may alter the color point or target spectrum of individual pixels.

Various embodiments are described herein that make use of a fully converting wavelength converting layer (e.g., phosphor layer) that produces a light output having a desired color point or target spectrum while limiting the energy ratio of pump light or optical power that passes through the wavelength converting layer unconverted (e.g., blue pump light) to total light or optical power emitted by the LED to less than 10% in some embodiments and less than 2% in some embodiments.

When used on a segmented LED where the segments are closely spaced, use of such a fully converting wavelength converting layer will reduce or eliminate the phenomenon of neighboring segments lighting up an undesired color or spectra because the fully converting wavelength converting layer will convert any stray light or optical power entering the segment to the desired color or spectra. In other words, any stray pump light or optical power crossing into a neighboring segment will cause the neighboring LED to emit a lower brightness light or optical power having the same color point or target spectrum as the energized segment. Further, light traveling in the fully converting wavelength converting layer away from an energized segment will still be the same pure phosphor color or spectrum since the phosphor layer may be made thick and/or dense enough so as to not mix in direct-leaking pump light or optical power (e.g., blue) above the energized segment. This enables very accurate color point or target spectrum selection for the segmented LEDs since optical cross talk between neighboring LEDs or segments does not affect the overall color point or target spectrum of the LED. In embodiments where an image of the segmented LED is projected onto the scene, use of the fully converting wavelength converting layers may also prevent optical cross talk between segments from shifting the color or spectrum, particularly at the rim of the segments, which could create a visible colored or spectrum transition at the scene. Thus, the color or spectrum illuminating the scene may be made constant and not varying as a function of the position of the projected image of the scene.

FIG. 1A is a diagram providing a view of a cross section of a segmented LED 100 taken across three addressable segments. The illustrated segmented LED 100A includes a semiconductor die that includes a light or optical power emitting structure formed from a substrate 110, such as a sapphire growth substrate, on which one or more n-type layers 130, one or more p-type layers 140, and a light or optical power emitting active region 135 are grown. Trenches 170a and 170b are formed in the die (e.g., by etching) to segment the LED 100A into segments 160a, 160b and 160c, which are electrically insulated from one another via the trenches. Each segment 160 is provided with its own contacts 145 and 150. The contacts 145 and 150 for each segment contact metal traces (not shown) on a circuit board 165, which allow current to be individually applied to each segment 160 so that the segments may be individually addressed and turned on in any combination and with the same or varying current level.

The light or optical power emitting semiconductor structure may be any light or optical power emitting semiconductor structure that emits light or optical power that may be converted via a wavelength converting material (e.g., to white light or a broader spectra). An example of such a semiconductor structure is a III-nitride structure that emits blue, violet or ultraviolet (UV) light, such as a semiconductor structure formed from one or more of binary, ternary, and quaternary alloys of gallium, aluminum, indium, and nitrogen. Other examples of semiconductor structures may include semiconductor structures formed from group III-V materials, II-phosphide materials, III-arsenide materials, II-VI materials, zinc oxide (ZnO), or Silicon (Si)-based materials. A semiconductor laser may also be used.

The n-type region 130 may be grown on a growth substrate 110 and may include one or more layers of semiconductor material. Such layer or layers may include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light or optical power emitting region to efficiently emit light or optical power. Like the n-type region 130, the p-type region 140 may include multiple layers of different composition, thickness, and dopant concentrations, including layers that are not intentionally doped, or n-type layers. While layer 130 is described herein as the n-type region and layer 140 is described herein as the p-type region, the n-type and p-type regions could also be switched without departing from the scope of the embodiments described herein.

The active region 135 may include a single thick or thin light or optical power emitting layer. Alternatively, the active region 135 may be a multiple quantum well light or optical power emitting region, which may include multiple thin or thick light or optical power emitting layers separated by barrier layers.

The p-contact 145 may be formed on a surface of the p-type region 140. The p-contact 145 may include multiple conductive layers, such as a reflective metal and a guard metal, which may prevent or reduce electromigration of the reflective metal. The reflective metal may be silver or any other suitable material. The re-contact 150 may be formed in contact with a surface of the n-type region 130 in a region where portions of the active region 135, the n-type region 140, and the p-contact 145 have been removed to expose at least a portion of the surface of the n-type region 130.

The n-contact 150 and p-contact 145 are not limited to the arrangement illustrated in FIG. 1A and may be arranged in any number of different ways. In embodiments, one or more n-contact vias may be formed in the light or optical power emitting semiconductor structure to make electrical contact between the n-contact 150 and the n-type layer 130. Alternatively, the n-contact 150 and p-contact 145 may be redistributed to form bond pads with a dielectric/metal stack as known in the art.

In the example illustrated in FIG. 1A, the growth substrate 110 is left on the die after segmentation. In other embodiments, the growth substrate 110 may be removed (e.g., using laser lift-off) to form thin film LED segments 160a, 160b, and 160c. A fully converting wavelength converting layer 120a is disposed over the die either in direct contact with the substrate 110 or thin film segments 160a, 160b and 160c. As described above, the fully converting wavelength converting layer 120a is a layer of wavelength converting material that produces a light or optical power output having a desired color point or target spectrum while limiting the energy ratio of pump light or optical power (e.g., blue pump light) that passes through the wavelength converting layer unconverted to total light or optical power emitted by the light emitting device to less than 10% in some embodiments and less than 2% in some embodiments. In embodiments, the wavelength converting material may be any luminescent material, such as a phosphor or phosphor particles in a transparent or translucent binder or matrix that absorbs light or optical of one wavelength and emits light or optical power of a different wavelength. In the example illustrated in FIG. 1, phosphor particles 125 are disposed in a transparent binder or matrix 126.

The concentration, composition and size of the phosphor particles, as well as the thickness of the fully converting wavelength converting layer 120a, may be tuned such that light or optical power emitted via the fully converting wavelength converting layer 120a may appear to be red, green, cyan, warm white, cool white or any other desired color or spectrum. In embodiments, the fully converting wavelength converting layer 120a may have a thickness between 20 μm and 100 μm. The maximum layer thickness will be related to the segment sizes. To reduce edge effects, the thickness should be ≤⅓ of the segment length. Concentration of phosphor particles to binder or matrix material may depend on the deposition technology and may range from 10% by volume to nearly 80% by volume. The size of the phosphor grains may range from median 1 μm to 50 microns. Denser concentrations of phosphor grains, smaller phosphor grains and thicker wavelength converting layers (i.e., on the upper end of the described ranges) may be used to suppress the pump light or optical power from passing through the layer unconverted. The composition of the phosphors included in the layer may be selected to produce the desired color point or target spectrum of light emitted through the layer, taking into account that only a small amount of the pump light (e.g., blue light) or optical power (e.g., UV or IR) will pass through. For example, the fully converting wavelength converting layer 120a may emit blue, red and green components. The wavelength converting phosphor layers may comprise a combination of phosphors that are commercially available. Using phosphor converted emission instead of direct light is beneficial for many applications, for example, due to the broader spectrum generated as well as that the semiconductor pump can be chosen the same and will have similar behavior in terms of, for example, current and temperature dependence.

When one or more of the segments 160 is energized by applying current to it via a corresponding trace on the circuit board 165, the one or more of the segments 160 emit light or optical having a first color or spectrum (color 1). In the example illustrated in FIG. 1A, the segment 160b is energized and emits light or optical power (e.g., ray 127) having the first color or spectrum (color 1), and the phosphors 125 in the wavelength converting layer 120a fully convert the light or optical of the first color or spectrum (color 1) to light of a second color or spectrum (color 2) such that the energy ratio of the pump light or optical power having the first color or spectrum (color 1) that passes through the wavelength converting layer 120a unconverted to total light or optical power emitted by the light or optical power emitting device 100A is limited to less than 10% in some embodiments and less than 2% in some embodiments.

In embodiments, color or spectrum 1 may be, for example, blue, violet or UV pump, respectively, and color or spectrum 2 may be, for example, one of a warm white color, a cool white color, red, cyan or green. In embodiments, the warm white color may have a color point between 1800K and 2500K and may appear orange in color, and the cool white may appear blue or cyan in color. While embodiments described herein are described with respect to the targeted white tuned colors, one of ordinary skill in the art will recognize the second color or spectrum (color 2) may be any color, such as red, green or blue, depending on the application.

Figure 1B:
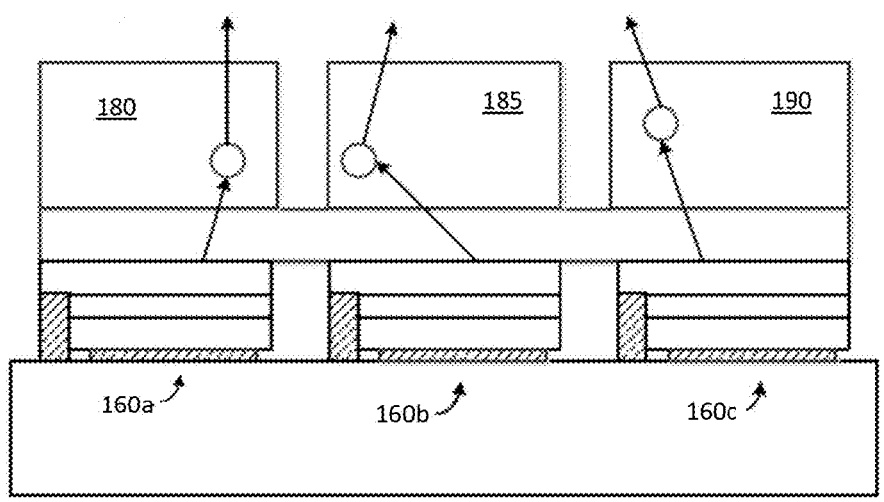
FIG. 1B is a diagram providing a view of a cross-section of an example segmented LED taken across three addressable segments with individual fully converting wavelength converting layers that are not fully optically sealed and are respectively disposed over one or more segments.

FIG. 1B is a diagram providing a view of a cross-section of another example segmented LED 100B taken across three addressable segments. In the example illustrated in FIG. 1B, instead of using a single fully converting wavelength converting layer 120a disposed over all segments 160, individual fully converting wavelength converting layers 180, 185 and 190 are disposed over respective segments or groups of respective segments (not shown). The individual fully converting wavelength converting layers may not be fully optically sealed to provide partially segmented fully converting wavelength converting.

Figure 1C:
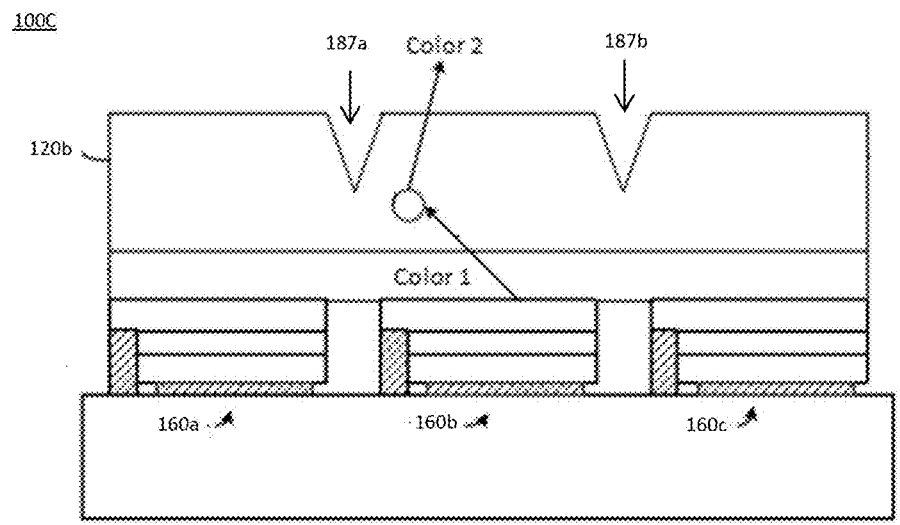
FIG. 1C is a diagram providing a view of a cross-section of an example segmented LED taken across three addressable segments with a single fully converting wavelength converting layer that is partially segmented and disposed over all segments.

FIG. 1C is a diagram providing a view of a cross-section of another example segmented LED 100C taken across three addressable segments. In the example illustrated in FIG. 1C, a single fully converting wavelength converting layer 120b is disposed over all segments 160. However, in FIG. 1C, the fully converting wavelength converting layer 120b is partially segmented by forming respective separations 187a and 187b between neighboring segments 160a, 160b and 160c. The separations 187a and 187b may be formed, for example, by making laser cuts in the fully converting wavelength converting layer 120b that do not fully cut through the layer 120b to provide a partially segmented fully converting wavelength converting layer 120b.

Figure 1D:
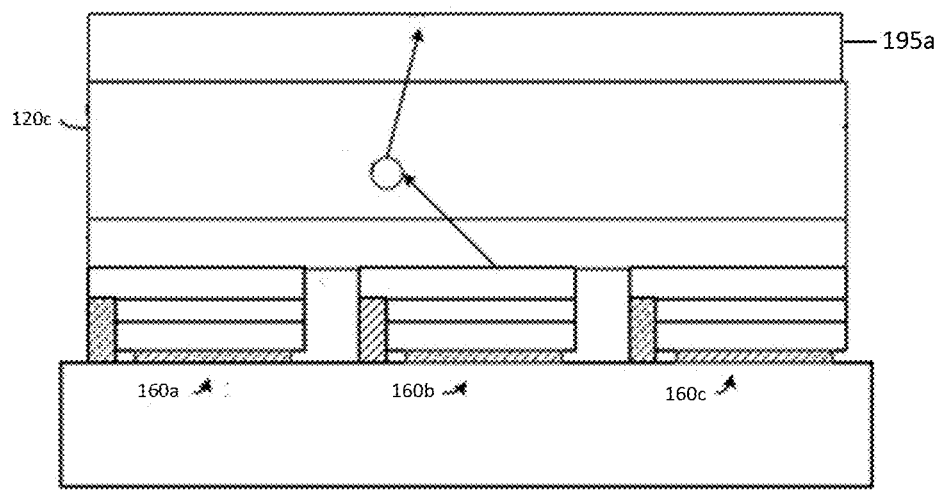
FIG. 1D is a diagram providing a view of a cross-section of an example segmented LED taken across three addressable segments with a scattering or off state white layer overlay.

FIG. 1D is a diagram providing a view of a cross-section of another example segmented LED 100D taken across three addressable segments 160a, 160b and 160c. In the example illustrated in FIG. 1D, the LED 100D includes a scattering or off state white layer 195a disposed over the fully converting wavelength converting layer 120c. The scattering or off state white layer 195a may include particles of TiOX, particles of other scattering material, or any off state white material, such as paraffin, disposed in an optically transparent material or matrix. The layer 195a may be used to provide scattering of light emitted by the individual segments, as described in more detail below, and/or to provide a white appearance to the segmented LED when it is turned off.

Figure 1E:
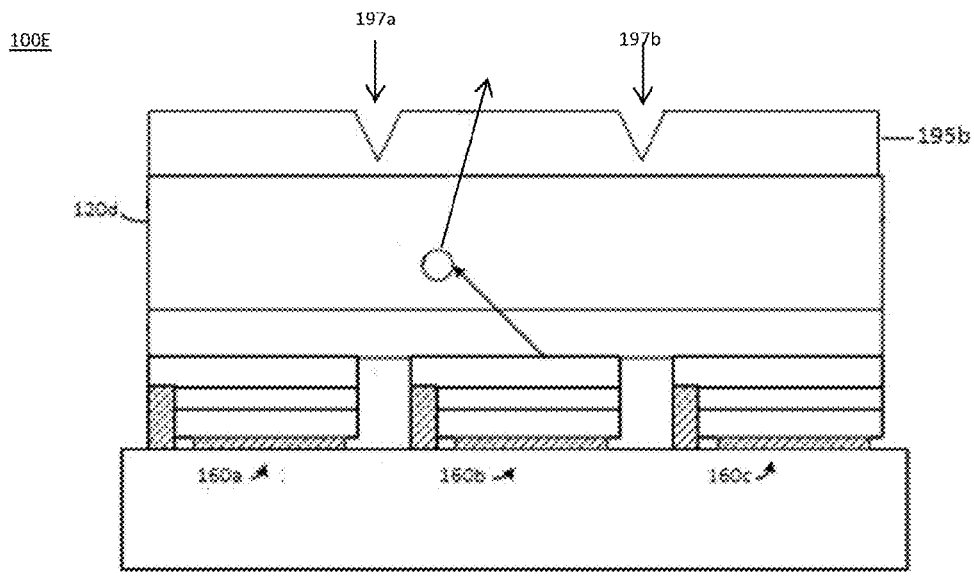
FIG. 1E is a diagram providing a view of a cross-section of an example segmented LED taken across three addressable segments with a partially segmented scattering or off state white layer overlay.

FIG. 1E is a diagram providing a view of a cross-section of another example segmented LED 100E taken across three addressable segments 160a, 160b and 160c. In the example illustrated in FIG. 1E, the scattering or off state white layer 195b is partially segmented by respective separations 197a and 197b formed in the layer 195b. Similar to the embodiment of FIG. 1C, the scattering or off state white layer 195b may be partially segmented by making laser cuts in the layer that do not fully cut through the layer so as to provide a partially segmented scattering or off state white layer 195b.

Figure 1F:
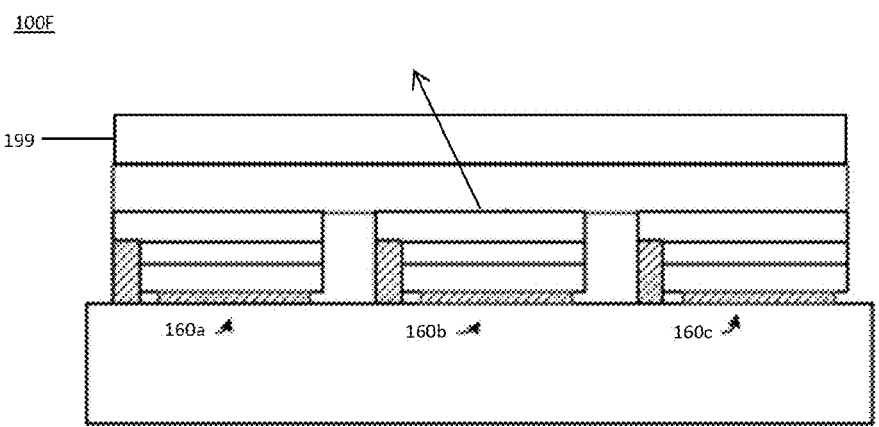
FIG. 1F is a diagram providing a view of a cross-section of an example segmented directed blue LED taken across three addressable segments.

FIG. 1F is a diagram providing a view of a cross-section of a direct blue segmented LED 100F. In the example illustrated in FIG. 1F, no wavelength converting layer is used, and the pump light or optical is emitted out of the LED in its original color or spectrum (e.g., blue). In embodiments, a scattering layer 199 may be disposed over the segments 160, as described in more detail below. The segmented layer may be non-segmented as shown in FIG. 1F or partially segmented as shown in FIG. 1E.

In embodiments where a partially segmented fully converting wavelength converting layer and/or a partially segmented scattering or off state white layer are used, the full conversion reduces or eliminates risk of color shading while the partial segmentation increases segment to segment contrast where desirable.

In the embodiments that follow, the segmented LEDs described may be any of the segmented LEDs described with respect to FIG. 1A, 1B, 1C, 1D, 1E or 1F or any variant that would be understood by one of ordinary skill in the art. In addition, while the term segmented LED is used, the segmented LED may be any type of silicon light or optical power emitting device, including lasers, and may emit visible or optical power (e.g., IR spectroscopy where targeted radiation is in the IR range and pump light or optical power can be UV up to red and may be LED based or laser based).

Figure 2:
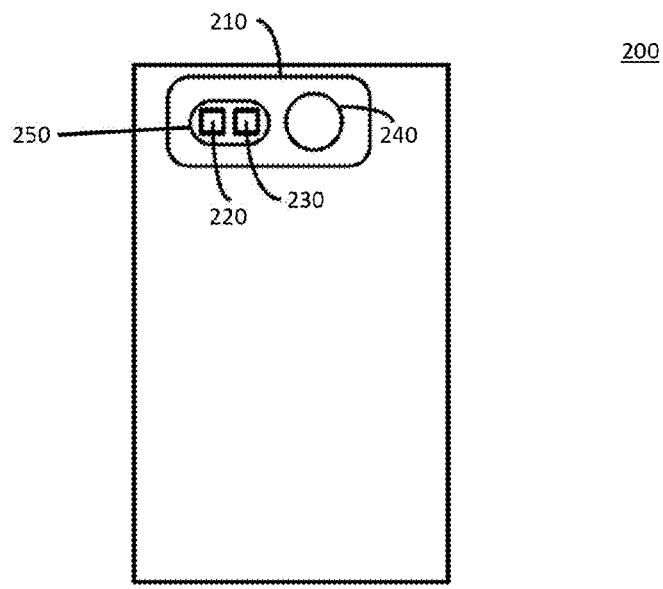
FIG. 2 is a diagram of the back of an example smart phone.

FIG. 2 is a diagram of the back of an example smart phone 200. The smart phone 200 illustrated in FIG. 2 has a camera module 210 that may include a lens (240) via which an image sensor unit may capture an image of a scene. The camera module 210 also includes a flash module 250 that may include one or more LEDs, such as multiple LEDs 100. In the example illustrated in FIG. 2, the flash module 250 includes two LEDs 220 and 230. One of ordinary skill in the art will understand, however, that one or more LEDs may be used consistent with the embodiments described herein. Examples of different potential arrangements for the one or more segmented LEDs in the flash module 250 are provided in FIGS. 3A, 3B, 3C.

Figure 3A:
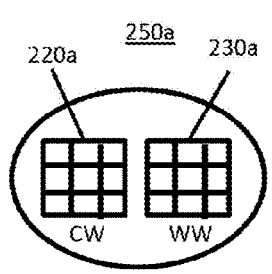
FIGS. 3A and 3B are diagrams of example flash modules that include dual segmented LEDs.
Figure 3B:
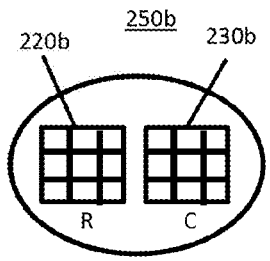

FIGS. 3A and 3B are diagrams of example flash modules 250 that include dual LEDs 220 and 230 as in FIG. 2. In the example illustrated in FIG. 3A, the flash module 250a includes a cool white segmented LED 220a and a warm white segmented LED 230a. The cool white segmented LED 220a may include a plurality of addressable segments, all of which may be covered by a fully converting wavelength converting layer that is tuned to emit light having a desired color, such as a cyan white color, which may be pumped by UV light, or may be a direct blue or direct cyan emitting LED. Example cyan white wavelength converting layers include BAM (Eu activated Ba—Mg-Aluminate), ZnS:Ag, or Sr3MgSi2O8:Eu (SMS). Note that for the visible application, the UV pumped cyan wavelength converting layer does not necessarily have to be fully converting if the application does not detect UV light. However it is still preferred for efficiency and safety reasons.

The warm white segmented LED 230a may similarly include a plurality of addressable segments, all of which may be covered by a fully converting wavelength converting layer that is tuned to emit light having color point in the warm white orange range. Example warm white fully converting wavelength converting layers may include BSSN ((Ba,Sr)2Si5N8:Eu), YAG:Ce, and Sr[LiAl3N4]:Eu2+.

In the example illustrated in FIG. 3B, the flash module 250b includes a red segmented LED 220b and a cyan segmented LED 230b. The red segmented LED 220b may include a plurality of addressable segments, all of which may be covered by a fully converting wavelength converting layer that is tuned to emit red light. Example red fully converting wavelength converting layers may include_B-SSN ((Ba,Sr)2Si5N8:Eu) or Sr[LiAl3N4]:Eu2+. The cyan segmented LED 230b may similarly include a plurality of addressable segments, all of which may be covered by a fully converting wavelength converting layer that is tuned to emit cyan light. An example cyan fully converting wavelength converting layer may include YAG:Ce, and Y,LuAG:Ce.

Figure 3C:
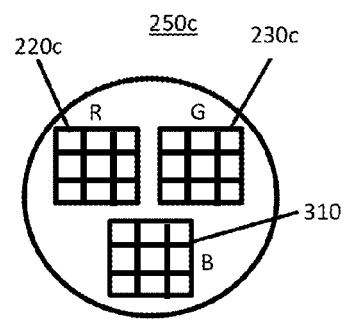
FIG. 3C is a diagram of an example flash module that includes three segmented LEDs.

FIG. 3C is a diagram of an example flash module 250c that includes three segmented LEDs 220c, 230c and 310. In the example illustrated in FIG. 3C, the flash module 250c includes a red segmented LED 220c, a green segmented LED 230c and a blue segmented LED 310. The red segmented LED 220c may be similar to the red segmented LED 220b of FIG. 3B. The green segmented LED 230c may include a plurality of addressable segments, all of which may be covered by a fully converting wavelength converting layer that is tuned to emit green light. Example green fully converting wavelength converting layers may include YAG:Ce phosphor or YLuAG-Ce phosphors.

The blue LED 310 (or a cool white LED in the blue range) may not need a wavelength converting layer as the active layer of the LED 310 may directly emit blue light. In embodiments, such as in FIG. 3C or FIG. 3A, where a direct blue LED may be used, the LED may include a light scattering layer, such as a layer of silicone into which TiOx particles are dispersed. The TiOx layer may be used to tune the source size to the phosphor covered LEDs (such as the red and green LEDs 220C and 230C). The scattering layer may also be used in such an embodiment to diffuse the light or optical power so that luminance distribution and radiation pattern from all the LEDs in the flash module are similar, which may allow use of the same optics for each LED for proper scene illumination.

One or more segmented LEDs 100 may be used in a flash module 250 of a camera module 210 for a number of different purposes, which are described in more detail below. In embodiments, light or optical power output by the one or more segmented LEDs may be mixed a short distance from the LED or LEDs such that the color point or spectrum of the overall light or optical power output of the flash module 250 may be tuned to match ambient lighting. In further embodiments, rather than mixing the light or optical power output by the segments, light or optical power from the individual segments of one or more segmented LEDs may be projected onto the scene to be photographed (e.g., using a Fresnel lens). This may be done, for example, to provide more even lighting at a scene to be photographed, to highlight different regions of a scene to be photographed, or to vary the color point or spectrum of light or optical power illuminating different regions of a scene to be photographed.

Figure 4:
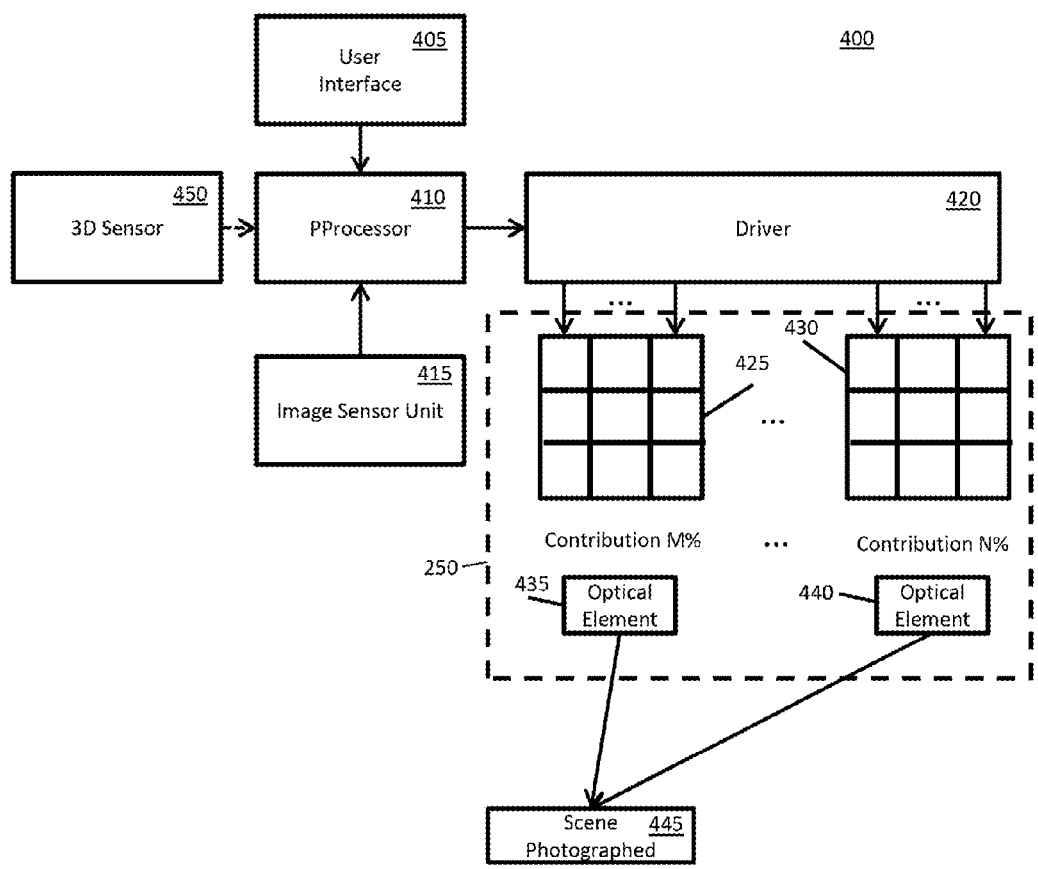
FIG. 4 is a block diagram of an example imaging system for use in a camera, such as a smart phone camera.

FIG. 4 is a block diagram of an example imaging system 400 for use in a camera, such as the smart phone camera module 210 of FIG. 2. The example imaging system 400 may be used to provide a flash output having a color point or spectrum that is tuned to the ambient lighting or to offset undesirable characteristics of the ambient light. The example imaging system 400 may also be used to vary the brightness of different segments and project an image of one or more segmented LEDs onto a scene to be photographed.

The example imaging system 400 illustrated in FIG. 4 includes a flash module 250 that includes two segmented LEDs 425 and 430, although one of ordinary skill in the art will understand that one or more than two segmented LEDs may be used in accordance with the embodiments described herein. The segmented LEDs may be coupled to a driver 420, which may supply power to the segmented LED or LEDs, as described in more detail below. The driver 420 may be coupled to a processor 410 (e.g., a microprocessor), which may be coupled to receive input from a user interface 405, an image sensor unit 415 and, optionally, a 3D sensor 450. In embodiments, the various circuits that control the segmented LEDs 425-430, such as the processor 410 and the driver 420, may be referred to as a controller.

The image sensor unit 425 may be an image sensor used for the purpose of measuring ambient light and/or creating an illumination profile for a scene. Alternatively, the image sensor unit 425 may include the main image sensor for the camera. In embodiments, a separate camera controller may be part of the image sensor unit 425 and may control the exposure of the image sensor. The user interface 405 may be, for example, a user-activated input device such as a button that a user presses to take a picture or a touch screen device. In embodiments, however, user input may not be required, such as where a picture may be taken automatically.

Optical elements 435 and 440 are provided for various purposes and may vary depending on the application for which they are being used. In embodiments, the optical elements may be collimating lenses, which may mix the light from corresponding segmented LEDs a short distance from the segmented LEDs and focus the combined light on the scene 445. In embodiments, the optical elements may be Fresnel lenses used to project images of corresponding segmented LEDs onto a scene to be photographed 445 (as described in more detail below).

The 3D sensor 450, if included, may be any suitable sensor capable of making a 3D profile of a scene to be photographed prior to capturing a final image of the scene. In embodiments, the 3D sensor 450 may be a time of flight (ToF) camera, and time may be used to calculate the distance to each object in the scene to be photographed. In embodiments, the 3D sensor 450 may be a structured light sensor, which may include a projection device that projects a specially designed pattern of light onto the scene. A camera may also be included in the structured light sensor to measure the position of each part of the light pattern reflected from the objects in the scene and determine the distance to the objects by triangulation. In embodiments, the 3D sensor 450 may be one or more auxiliary cameras positioned at a distance from each other in the body of a device. By comparing the position of the objects as seen by the auxiliary camera or cameras, distances to each object may be determined by triangulation. In embodiments, the 3D sensor 450 may use the autofocus signal of the main camera in the device (e.g., the image sensor unit 415). While scanning the focus position of the camera lens, the system may detect at which positions which parts of the scene are in focus. A 3D profile of the scene may then be built by translating the corresponding lens positions into the distances to the objects that are in focus for these positions. A suitable autofocus signal may be derived by conventional methods, such as by measuring the contrast or by using phase detection sensors within the camera sensor. When phase detection sensors are used, in some embodiments, for optimal functioning of the flash module, the positions of individual phase detection sensors may correspond to areas illuminated by separate segments of one or more segmented light emitting device, as described below.

In embodiments where light from multiple segments in a segmented light emitting device is mixed before the light is focused onto the scene, the processor 410 may determine the color point of the ambient lighting and control the driver 420 to tune the mixed light output by the one or more segmented LEDs 425-430 to match the color point of the ambient lighting or to offset undesirable characteristics of the ambient light. This may be done by controlling the driver 420 to address particular segments of each of the segmented LEDs or the single LED such that each color represents a particular percentage of the overall light output. By way of example, if the segmented light emitting device 425 is a warm white device and the segmented light emitting device 430 is a cool white device, and the color point of the ambient lighting represents a color point that is 75% cool and 25% warm, 75% of the segments in the cool white device 430 may be addressed and 25% of the segments in the warm white device 425 may be addressed. In such an embodiment, the same current may be applied to each addressed segment to maintain an accurate color point. In other embodiments, different currents may be applied to different addressed segments to make them emit brighter light, and the processor 410 will account for the difference in brightness when determining how many segments in each segmented light emitting device to address. The processor 410 may behave similarly when different numbers of segmented LEDs are used and when segmented LEDs of different colors are used.

Figure 5:
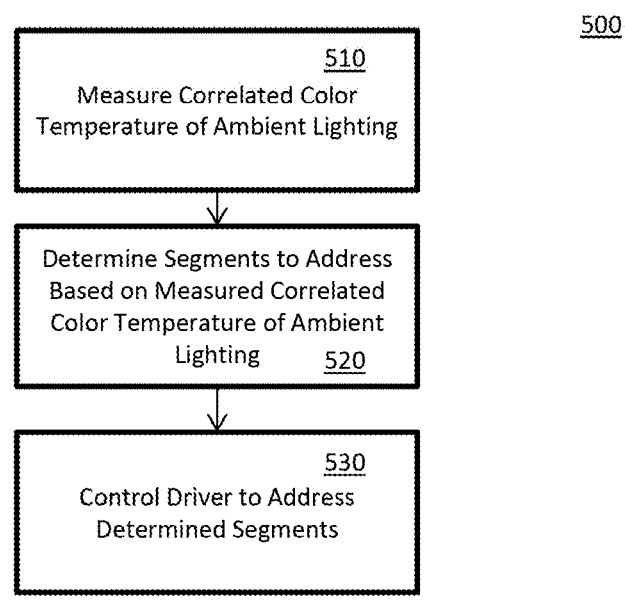
FIG. 5 is a flow diagram of an example method of operating one or more segmented LEDs where light or optical power output by the segments is mixed a short distance from the one or more LEDs.

FIG. 5 is a flow diagram 500 of an example method of operating one or more segmented light emitting devices where light output by the segments is mixed. In the example illustrated in FIG. 5, the method includes measuring the color point of the ambient lighting (510). This may be done according to any method known in the art, such as by controlling the image sensor unit 415 to initially image the scene 445 and analyzing the image to determine the color point of the ambient light. The segments to address for each of the one or more segmented light emitting devices may then be determined (520). This may be done, for example, by the processor 410 accessing a look up table, which may tell the processor 410 which segments to address based on the determined color point of the ambient light to either match the color point of the ambient light or offset particular characteristics of light (such as greenish characteristics of fluorescent light). The processor 410 may then control the driver 420 to address the determined segments (530).

In embodiments where an image of the segmented LED or LEDs is projected onto the scene 445, the processor 410 may determine an optimal illuminance profile for the scene 445 and control the driver 420 to address certain segments and use certain currents to drive particular segments based on the determined optimal illuminance profile. One or more Fresnel lenses may be used to project an image of each segmented light emitting device onto the scene to be photographed 445.

Figure 6A:
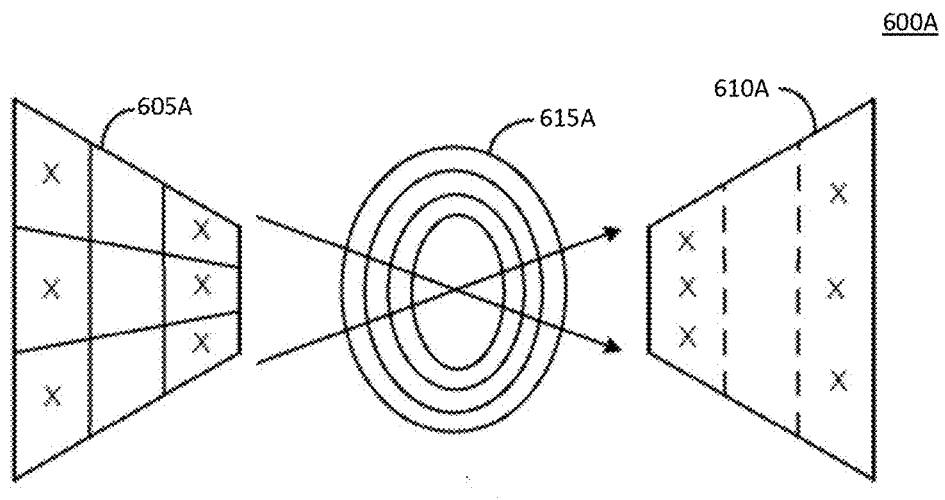
FIGS. 6A, 6B, 6C and 6D are diagrams of example imaging systems showing different arrangements of Fresnel lenses for projecting an image or images of the one or more segmented LEDs onto a scene to be photographed.
Figure 6B:
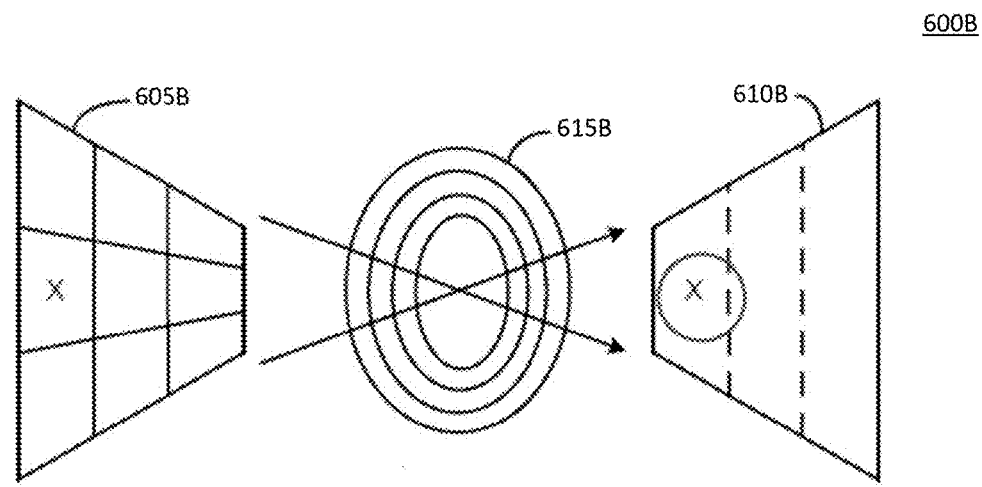

FIGS. 6A, 6B, 6C and 6D are diagrams of example imaging systems showing different arrangements of segmented light emitting devices and Fresnel lenses for projecting an image or images of the one or more segmented LEDs onto an image to be photographed 445. In FIGS. 6A and 6B, the imaging systems 600A and 600B each include a respective single segmented LED 605A/605B and a respective Fresnel lens 615A/615B that are used to illuminate a scene 610A/610B. As can be seen in the illustrations, certain segments of the segmented light emitting devices 605A/605B are activated (indicated with an X) and the image of the segmented LED 605A/605B is projected, using the Fresnel lens 615A/615B, such that a mirror image of the pattern produced by activating the segments indicated with an X is projected onto the scene 610A/610B (light pattern projected onto the scene is indicated with Xs in the figures).

Figure 6C:
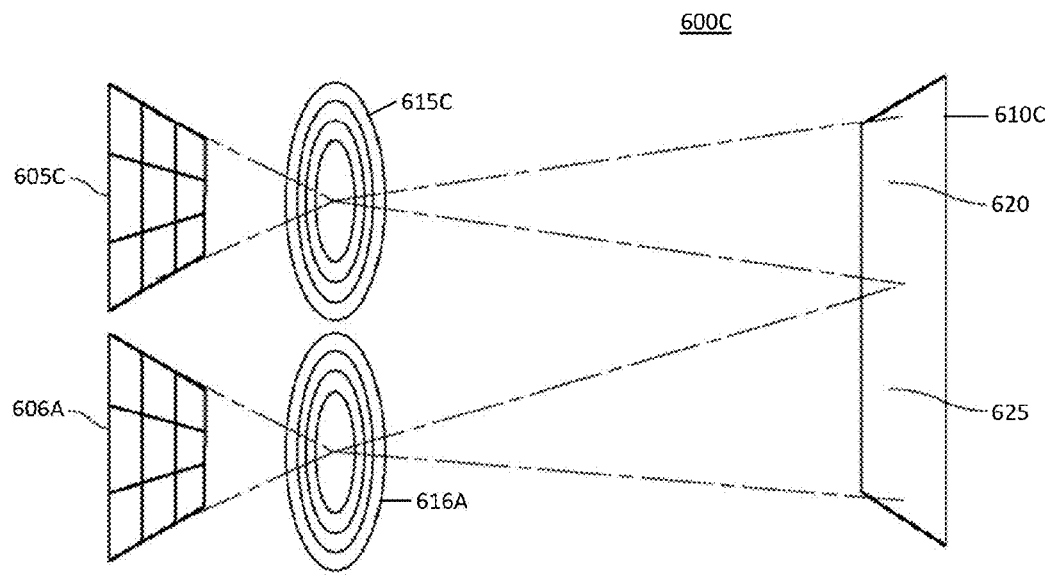
Figure 6D:
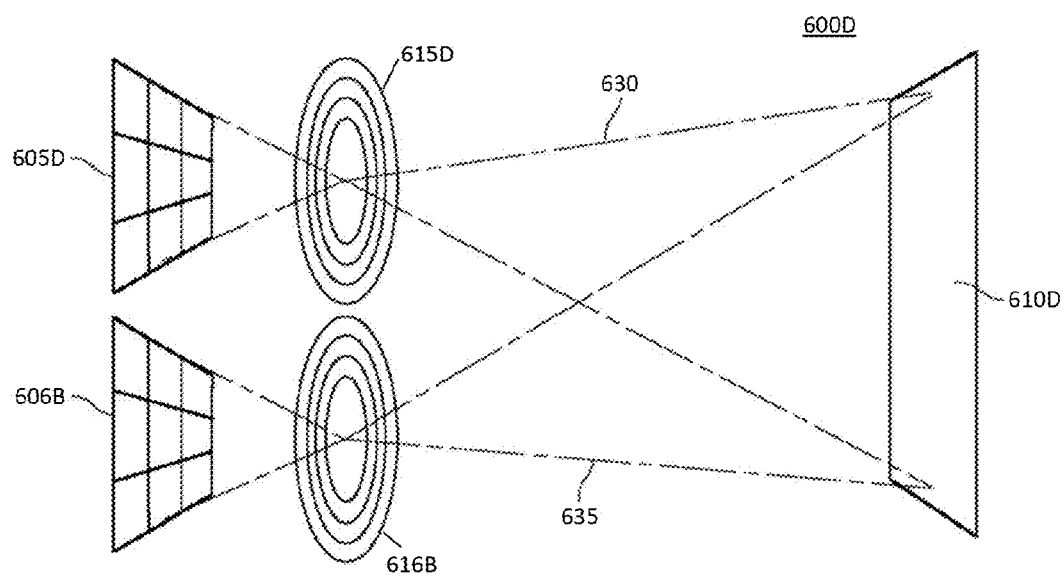

In FIGS. 6C and 6D, two segmented LEDs and two corresponding Fresnel lenses are used. In FIG. 6C, the imaging system 600C includes two segmented LEDs 605C and 606A and two Fresnel lenses 615C and 616A. The Fresnel lenses 615C and 616A are each configured to project an image of a respective segmented LED 605C and 606A onto a corresponding region of the scene 620. In the example illustrated in FIG. 6C, the lens 615C projects an image of the segmented LED 605C onto an upper region 620 of the scene 610A and the lens 616A projects an image of the segmented LED 606A onto a lower region 625 of the scene 610A. As described in more detail below, this can enable the system 600C to achieve different lighting effects, such as projecting a warmer light onto a lower portion of the scene and a cooler light onto an upper portion of the scene. In some embodiments, the segmented LEDs 605C and 606A may illuminate overlapping portions of the scene 610A in order to provide more light to the overlapping parts. For example, the arrays projected onto the scene may overlap in the center of the scene, which often requires more light than the edges of the scene.

In FIG. 6D, the imaging system 600D includes two segmented LEDs 605D and 606B and two Fresnel lenses 615D and 616B. In the example illustrated in FIG. 6D, the system 600D may be color tunable. The segmented light emitting devices 605D and 606B emit respective beams 630 and 635, which overlap when illuminating the scene 610D. The processor 410 may calculate the appropriate current to be supplied to each segmented LED 605D/606B such that the sum of light from the arrays has the desired illuminance and color point for each portion of the scene. Additional segmented LEDs (or light emitters) emitting additional colors may be added consistent with the embodiments described herein.

FIGS. 7A, 7B, 8A, 8B, 9A, 9B, 10A and 10B provide examples of different ways segments of one or more segmented LEDs may be addressed with a single current or varying currents to illuminate a target object 710 in a scene 700 differently. More details are provided in PCT Appln. Pub. No. WO/2017/080875, filed Nov. 2, 2016, which is incorporated by reference as if fully set forth herein. In embodiments, the target 710, identified by the dashed circle in the figures, may require more light than the rest of the scene, according to a calculated illumination profile.

One consideration in distributing current to be applied to one or more segments of a segmented LED is that, for some devices, such as mobile or other battery-powered devices, the maximum amount of current available for the flash module 250 is limited by the capabilities of the device battery. When defining drive current levels to all the segments, the system may take into account the maximum available current and define the drive current level for each segment such that the total drive current does not exceed the maximum while the correct ratio of intensity between the segments is maintained and total light output is maximized.

Figure 7A:
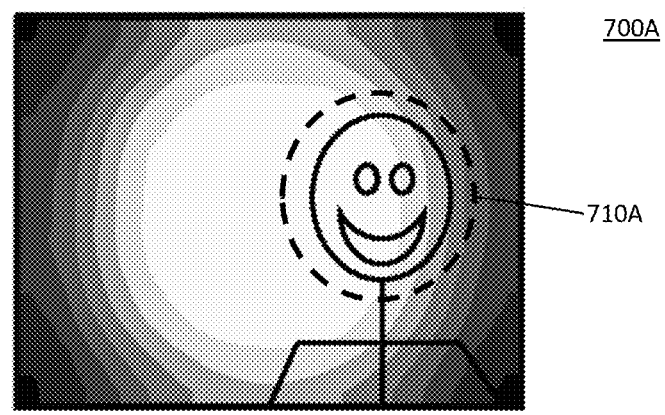
FIGS. 7A, 7B, 8A, 8B, 9A, 9B, 10A and 10B are diagrams illustrating examples of different ways segments of one or more segmented LEDs may be addressed with a single current or varying currents to illuminate a target object in a scene differently.
Figure 7B:
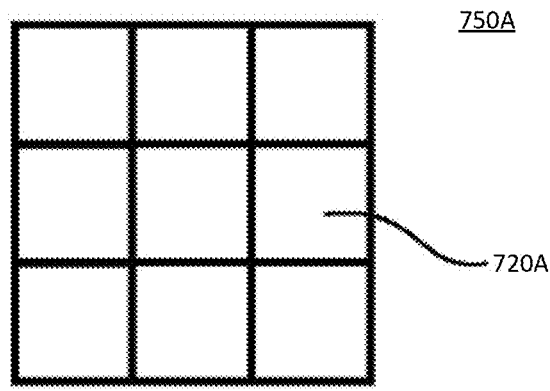

FIG. 7A illustrates how the scene 700A is illuminated when all segments 720A of a segmented LED 750A (illustrated in FIG. 7B) are addressed and supplied with the same amount of current. As illustrated, the center of the scene is more illuminated than the edges and, in particular, the portion of the target 710A located near the center of the scene is more illuminated than the portion of the target 710A located near the edge of the scene.

Figure 8A:
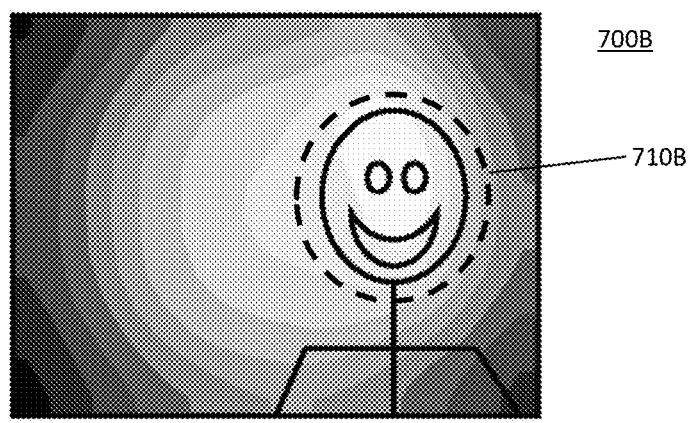
Figure 8B:
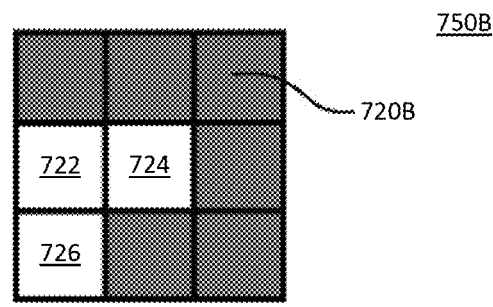

FIG. 8A illustrates how the scene 700B is illuminated when a subset of the segments 720B, and particularly three segments 722, 724 and 726 in the middle and lower left hand region of the segmented LED 750B (illustrated in FIG. 8B) are addressed and supplied with the same current while the rest of the segments 720B are not addressed and are supplied with no current. As illustrated in FIG. 8A, the right side of the scene 700B corresponding roughly to the target 710B is more brightly illuminated than the rest of the scene 700B. The current density for the addressed segments 722, 724 and 726 may be three times higher than the addressed segments in FIG. 7B where all segments 720A are supplied with the same current. Therefore, the illuminance of the target 710B in FIG. 8A may be about 1.6 times higher than the illuminance of the target 710A in FIG. 7A. To obtain higher illuminance, fewer segments may be addressed.

Figure 9A:
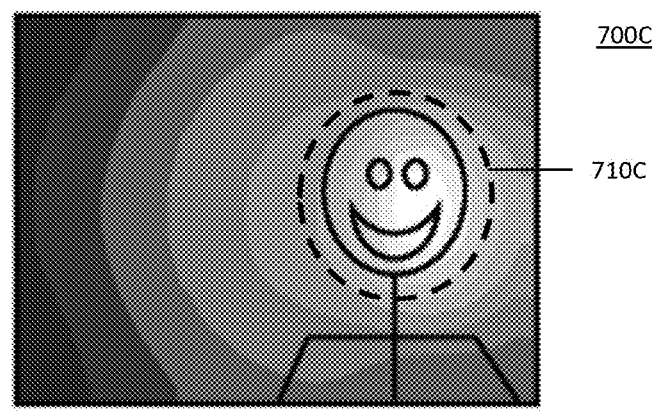
Figure 9B:
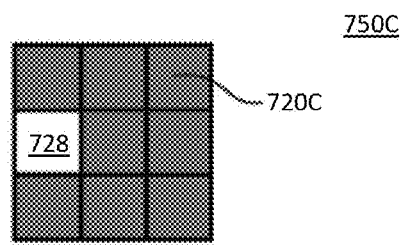

FIG. 9A illustrates how the scene 700C is illuminated when a single segment 720C is addressed and supplied with the maximum current while the other eight segments 720C are not addressed and supplied with no current. In the example illustrated in FIG. 9B, the segment 728 in the center of the left-most column is addressed and provided with the maximum current. As illustrated in FIG. 9A, the right side of the scene 700C corresponding roughly to the target is more brightly illuminated than the rest of the scene 700C, although the highly illuminated spot is smaller than in FIG. 8A, for example. The illuminance of the target in FIG. 8A, however, is greater than the illuminance of the target in FIG. 7A, for example.

In embodiments, to improve uniformity of illuminance across the entire target 710, the processor 410 may control the driver 420 to vary the current supplied to different addressed segments.

Figure 10A:
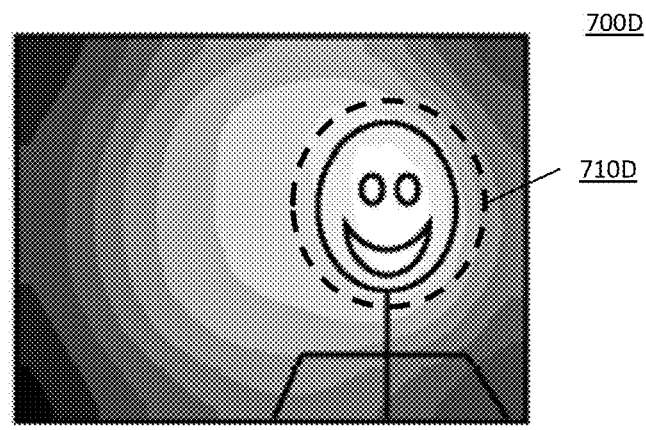
Figure 10B:
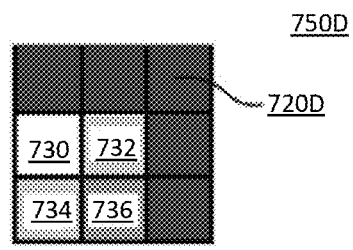

FIG. 10A illustrates how the scene 700D is illuminated when four segments 720D are addressed and supplied with varying levels of current and five segments 720D are not addressed and are supplied with no current. In the example illustrated in FIG. 10B, the center segment 730 in the left-most column is supplied with four times more current than the bottom segment 736 in the center column and with twice as much current as the center segment 732 and the bottom segment 734 in the left-most column. The top row and right-most column of segments 720D receive no current, as illustrated in FIG. 10B. As illustrated in FIG. 10A, the right side of the scene 700D corresponding roughly to the target 710D is more brightly illuminated than the rest of the scene 700D, and the illuminance of the target 710D is more uniform than in, for example, FIGS. 7A, 8A, and 9A.

In other embodiments, when the processor 410 receives an instruction from, for example, the user interface 405, to zoom in the camera lens, segments near the center of the segmented LED may receive more current. In embodiments, illuminance at the center of the scene may be increased by 1.15 times over the center of the scene illustrated in FIG. 7A. In other embodiments, illuminance at the center of the scene may be increased by 2.2 times over the center of the scene illustrated in FIG. 7A. In contrast, when the processor 410 receives an instruction from, for example, the user interface 405, to zoom out the camera lens, segments near the edges of the segmented LED may receive more current. For wide angle applications, the segments at the edges of the segmented LED may receive equal current while the center segment may receive no current. In embodiments, illuminance at the center of the scene may be reduced to 0.85 times the illuminance at the center of the scene in FIG. 7A, for example.

The system 400 may also be used to illuminate multiple targets, for example, by providing current only to segments corresponding to each target or by providing more current to segments corresponding to each target. Additionally, the system 400 may be used to reduce overexposure in a scene containing elements that are close to the camera and far from the camera by providing current only to the segments corresponding to the elements far from the camera or by providing more current to segments corresponding to the elements far from the camera. While embodiments described herein provide for automated methods of controlling flash color point and brightness distribution, the user interface 405 may also be used to provide a user with personal control over the flash color point and brightness distribution.

While the embodiments described above, for example with respect to FIGS. 7A, 7B, 8A, 8B, 9A, 9B, 10A and 10B, are described with respect to a single segmented LED, one of ordinary skill in the art will recognize that they are equally applicable to embodiments where more than one segmented LED is included in a flash module. For example, if two segmented LEDs emit a different white light color point, the same segments in each may be addressed to ensure good overlapping of the LEDs' images over the scene to ensure a uniform illuminating color and the relative amounts of each color point to the combined illumination may be adjusted, in some embodiments, by varying the current to one of the LEDs.

The illuminance values for the examples provided above are calculated for the illustrated 3×3 segmented LED with a single Fresnel lens. However, they can be adapted for segmented LEDs having different numbers of segments and for multiple segmented LEDs with multiple Fresnel lenses, as described in embodiments above. The light output of each segment may be controlled by the driver current of the segmented LED or by pulse duration with a fixed current.

Figure 11:
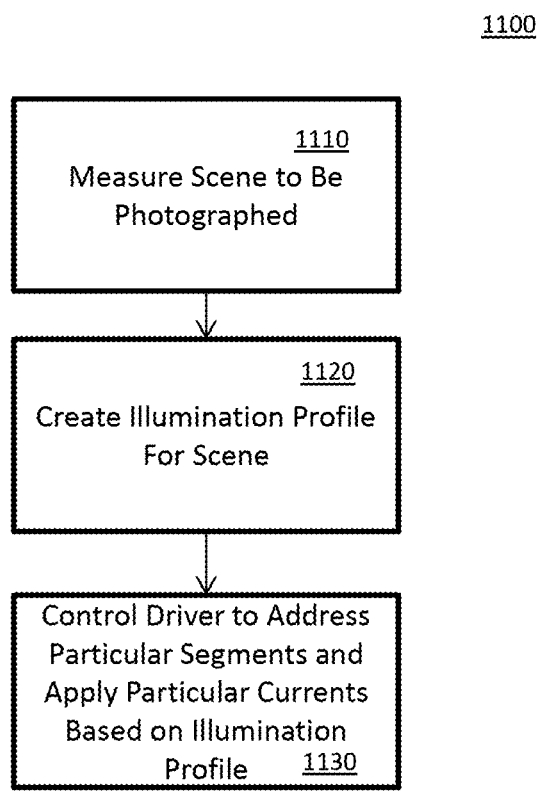
FIG. 11 is a flow diagram of an example method of operating one or more segmented LEDs where light output by the segments is projected onto the scene.

FIG. 11 is a flow diagram of an example method 1100 of operating one or more segmented LED where light output by the segments is projected onto the scene. In the example illustrated in FIG. 11, the method includes measuring a scene to be photographed (1110) and creating an illumination profile for a scene (1120). The driver 420 may then be controlled to address particular segments of the one or more segmented LED to apply particular currents to the addressed segments based on the illumination profile (1130).

In embodiments, the scene may be measured using one or more of 3D sensor 450 and the image sensor unit 415. In one example, the user interface 405 may provide an instruction to the processor 410 indicating that a picture is to be taken. The image sensor unit 415 or 3D sensor 450 may capture a first preliminary image of the scene 445, corresponding to the field of view of the image sensor unit 415, with the flash module 250 turned off. The flash module 250 may then be turned on in a lower light output mode (e.g., torch mode). At this time, the illuminance profile of the flash module may be set to uniform, meaning that all regions of the scene 445 are illuminated with a known illumination profile. A second preliminary image may then be captured using the image sensor unit 415 or 3D sensor 450 while the flash module 250 continues to be on with the uniform illuminance profile and low brightness. The processor 410 may then calculate the optimum brightness for all regions of the scene 445 to achieve optimal exposure. This may be done, for example, by subtracting the pixel brightness values of the first preliminary image from the respective pixel brightness values of the second preliminary image and scaling the differences to achieve the optimal exposure levels. The final image of the scene 445 may then be captured by the image sensor unit 415 with the flash module 250 activated according to the determined illuminance profile.

In another example, the processor 410 may receive an input, such as from the user interface 405, indicating that a picture should be taken. The processor 410 may then control the image sensor unit 415 or 3D sensor 450 to capture a first preliminary image of the scene 445 corresponding to the field of view of the image sensor unit 415 with the flash module 250 turned off. A 3D profile of the scene 445 may then be generated. For example, the 3D sensor 450 may generate the 3D profile of the scene or the 3D sensor 450 may sense data about the scene 450 and transmit the data to the processor 410, which may generate the 3D profile of the scene. The processor 410 may then calculate the optimum brightness for all parts of the scene 445 to achieve optimal exposure. Based on the calculation, the processor 410 may control the driver 420 to illuminate the scene 445 using the flash module 250.

In yet another example, the processor 410 may receive an input, such as from the user interface 405, indicating that a picture should be taken. The processor 410 may then control the image sensor unit 415 or the 3D sensor 450 to capture a first preliminary image of the scene 445 corresponding to the field of view of the image sensor unit 415 with the flash module turned off. A 3D profile of the scene 445 may then be generated. At this time, the illuminance profile of the flash module may be kept uniform, meaning that all portions of the scene 445 are illuminated. A second preliminary image may then be captured with the flash module 250 in torch mode. The processor 410 may then calculate the optimum brightness for all portions of the scene 445 to achieve optimal exposure based on the two preliminary images captured and 3D profile (as described in the second example above). The image sensor unit 415 may then capture the final image with the flash module 250 activated according to the calculated illuminance profile.

One or more illumination modes may also be defined for embodiments described herein. For example, in a first group of illumination modes, illumination from the flash module 250 may be distributed across the scene to achieve the most homogenously useful illuminated picture. In particular, in some embodiments, overexposure may be minimized, such as in the case where the foreground is well illuminated by ambient light, all light may be directed from the flash module 250 to the background of the scene 445. In some embodiments, the flash module 250 may act as a fill in flash, such as where the background is well illuminated by the ambient light and all light from the flash module 250 is directed to the foreground. In some embodiments, where the foreground and background are evenly illuminated by ambient lighting, light from the flash module 250 may be sent mostly to the background. In some embodiments, where the foreground is dark, light from the flash module 250 may illuminate the foreground just enough to generate a good picture and the rest of the light from the light module is sent to the background.

In embodiments, in a second group of illumination modes, selected objects may be illuminated. In particular, in some embodiments, in combination with face recognition, faces (or other objects) may be weighted highest for the best illumination. In some embodiments, in combination with face recognition, background around faces (or other objects) may receive less light, for example to increase contrast between the illuminated face or other object and the background nearest the face or other object. In some embodiments, selected zones may include zoomed-in images or otherwise identified portions of the scene 445. In some embodiments, for pictures of, for example, business cards, light from the flash module 250 may be emitted with a very high uniformity profile.

While specific embodiments are described above with respect to LED flash, one or more segmented LEDs with fully converting wavelength converting layers, as in any of the embodiments above, may be used in other types of general lighting, such as torch for video, studio lighting, theater/stage lighting or architectural lighting. Further, while specific pump light sources are described, any suitable pump light may be used for the segmented LEDs, including non-visible optical power. Also, while the embodiments address the visible illumination application, other cases, such as IR irradiation and IR spectroscopy including a wavelength conversion step, may also benefit from the well-defined emitted spectrum without pump light leakage. In these non-visible optical power applications, instead of converting the color point of light using the fully converting wavelength converting layer, the spectrum is converted to a target spectrum. Further, in instances where only visible light emission or conversion are described, it is intended that optical power emission or conversion may be substituted.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A segmented semiconductor light or optical power emitting device comprising:
    a die including a light or optical power emitting semiconductor structure comprising a light or optical power emitting active layer configured to emit light or optical power having a first color point or spectrum and disposed between an p-layer and a p-layer, a plurality of trenches formed in at least the light or optical power emitting semiconductor structure that separate the die into a plurality of individually addressable segments; and
    at least one wavelength converting layer adjacent the die, the at least one wavelength converting layer configured to convert the light or optical power emitted by the at least one active layer to light or optical power having at least one second color point or spectrum different from the first color point or spectrum and to limit an energy ratio of the light or optical power emitted by the active layer that passes through the at least one wavelength converting layer unconverted to total light or optical power emitted by the segmented semiconductor light or optical power emitting device to less than 10%.

2. The device of claim 1, wherein the at least one wavelength converting layer is further configured to limit the energy ratio of the light or optical power emitted by the active layer that passes through the at least one wavelength converting layer unconverted to total light or optical power emitted by the segmented semiconductor light or optical power emitting device to less than 2%.

3. The device of claim 1, wherein the first color point or spectrum corresponds to blue light, violet light or ultraviolet (UV) light.

4. The device of claim 1, wherein the second color point corresponds to one of a cool white, a warm white, orange, red, cyan, blue or green.

5. The device of claim 1, further comprising a respective contact in contact with the n-layer of each segment and a respective contact in contact with the p-layer of each segment, each contact coupled to at least one trace on a circuit board for the individual addressing of the segments.

6. The device of claim 1, wherein the light or optical power emitting semiconductor structure is disposed on a substrate, the trenches are formed through the p-layer, the active layer and at least a portion of the n-layer, and the wavelength converting layer is disposed in contact with the substrate.

7. The device of claim 1, wherein the trenches are formed through the p-layer, the active layer and at least a portion of the n-layer, and the wavelength converting layer is disposed in contact with the n-layer.

8. The device of claim 1, wherein the device is a semiconductor laser.

9. The device of claim 1, wherein the first spectrum is in a range from UV to red and the second spectrum is infrared.

10. The device of claim 1, wherein the wavelength converting layer is partially segmented.

11. An illumination device comprising:
    a first segmented semiconductor light or optical power emitting device comprising a first die that includes a first light or optical power emitting semiconductor structure comprising a first light or optical power emitting active layer configured to emit light or optical power having a first color point or spectrum and disposed between a first n-layer and a first p-layer, a plurality of first trenches are formed in at least the first light or optical power emitting semiconductor structure to separate the first die into a plurality of first individually addressable segments, all of the plurality of first individually addressable segments are covered by a first wavelength converting layer configured to convert the light or optical power emitted by the first active layer to light having a second color point or spectrum different from the first color point or spectrum and to limit an energy ratio of the light or optical power emitted by the first active layer that passes through the at least one first wavelength converting layer unconverted to total light or optical power emitted by the first segmented semiconductor light or optical power emitting device to less than 10%; and
    a second segmented light or optical power emitting device comprising a second light or optical power emitting semiconductor structure comprising a second light or optical power emitting active layer configured to emit light or optical power having a third color point or spectrum that is the same as, or different than, the first color point or spectrum, and disposed between a second n-layer and a second p-layer, a plurality of second trenches are formed in at least the second light or optical power emitting semiconductor structure to separate the second die into a plurality of second individually addressable segments.

12. The illumination device of claim 11, further comprising a second wavelength converting layer, disposed over all of the plurality of second individually addressable segments, configured to convert the light or optical power emitted by the second active layer to light or optical power having at least one fourth color point or spectrum different from the second color point or spectrum and the third color point or spectrum and to limit an energy ratio of the light or optical power emitted by the second active layer that passes through the at least one second wavelength converting layer unconverted to total light or optical power emitted by the second light or optical power emitting device to less than 10%.

13. The illumination device of claim 12, wherein the first wavelength converting layer and the second wavelength converting layer are configured to limit the energy ratio of the light or optical power emitted by the first active layer and the second active layer, respectively, that passes through the first wavelength converting layer and the second wavelength converting layer unconverted to total light or optical power emitted by the first segmented light or optical power emitting device and the second segmented light or optical power emitting device, respectively, to less than 2%.

14. The illumination device of claim 12, wherein the second color point is one of warm white or orange and corresponds to a color point between 1800K and 2500K, and the fourth color point is cool white, blue, or cyan.

15. The illumination device of claim 12, wherein the second color point corresponds to red light and the fourth color point corresponds to cyan light.

16. The illumination device of claim 12, wherein the first and third color point or spectrum correspond to at least one of blue light or UV light.

17. The illumination device of claim 12, further comprising a third segmented light or optical power emitting device comprising a third die that includes a third light or optical power emitting semiconductor structure comprising a third light or optical power emitting active layer configured to emit blue, violet, or ultraviolet (UV) light or optical power and disposed between a third n-layer and a third p-layer, a plurality of trenches formed in at least the third light or optical power emitting semiconductor structure to separate the third die into a plurality of third individually addressable segments, a plurality of contacts disposed in contact with the third p-layer and the third n-layer on a first surface of the third light or optical power emitting structure, and a light scattering layer in direct contact with a second surface of the third light or optical power emitting structure that is opposite the first surface.

18. The illumination device of claim 17, wherein the second color point corresponds warm white or orange, the first color point or spectrum corresponds to blue, violet or UV light, and the illumination device further comprises a light scattering layer covering the plurality of third individually addressable segments.

19. The illumination device of claim 11, further comprising:
at least one optical element configured to mix light output from the first and second segmented light or optical power emitting devices and provide the mixed light onto a scene to be photographed; and
a controller configured to address any of a plurality of different combinations of the first and second individually addressable segments in the first and second segmented light or optical power emitting devices such that the mixed light provided to the scene has a determined color point based on ambient lighting.

20. The illumination device of claim 11, further comprising:
at least one Fresnel lens configured to project an image of the first and second segmented light or optical power emitting devices onto a scene to be photographed; and
a controller configured to address any of a plurality of different combinations of the first and second individually addressable segments in the first and second segmented light or optical power emitting devices.

21. The illumination device of claim 20, wherein the controller is further configured to apply currents having at least two different levels to different ones of the addressed first and second individually addressable segments based on a determined illumination profile for the scene to be photographed.

22. The illumination device of claim 11, wherein the illumination device comprises two Fresnel lenses, each configured to project an image of a respective one of the first and second segmented light or optical power emitting devices onto a scene to be photographed such that the light or optical power having the second color point or spectrum and the light or optical power having the third color point or spectrum overlap at the scene to create a desired brightness distribution based on the determined illumination profile and a determined, pre-determined or selected color point or spectrum.

23. The illumination device of claim 11, wherein at least one of the first and second segmented light or optical power emitting devices is a laser.

* * * * *

UNITED STATES PATENT AND TRADEMARK OFFICE
CERTIFICATE OF CORRECTION

PATENT NO. : 10,222,681 B2  
APPLICATION NO. : 15/803803  
DATED : March 5, 2019  
INVENTOR(S) : Van Der Sijde et al.

Page 1 of 1

It is certified that error appears in the above-identified patent and that said Letters Patent is hereby corrected as shown below:

On the Title Page

Item (73), in "Assignee", in Column 1, Line 1, delete "Limileds" and insert --Lumileds-- therefor In the Specification In Column 5, Line 2, delete "re-contact" and insert --n-contact-- therefor In Column 7, Line 32, delete "FIG." and insert --FIGS.-- therefor In Column 14, Line 23, delete "450" and insert --445-- therefor In the Claims In Column 15, Line 60, in Claim 1, delete "p-layer" and insert --n-layer-- therefor Signed and Sealed this  
Twenty-sixth Day of October, 2021

Drew Hirshfeld  
*Performing the Functions and Duties of the*  
*Under Secretary of Commerce for Intellectual Property and*  
*Director of the United States Patent and Trademark Office*